United States Patent [19]

Takizawa et al.

[11] Patent Number: 5,124,948
[45] Date of Patent: Jun. 23, 1992

[54] MASK ROM WITH SPARE MEMORY CELLS

[76] Inventors: Makoto Takizawa, 328 Kamiasao, Asao-ku; Taira Iwase, 1-5, Shirayuki-So, 92 Akutsu, Takatsu-ku, both of Kawasaki; Masamichi Asano, 45-7-308, Denenchofuhoncho, Oota-ku, Tokyo; Yasunori Arime, 102 Koito-Heights, 1-774, Shinmarukohigashi, Nakahara-ku, Kawasaki, all of Japan

[21] Appl. No.: 751,574

[22] Filed: Aug. 22, 1991

Related U.S. Application Data

[63] Continuation of Ser. No. 545,114, Jun. 27, 1990, abandoned, which is a continuation of Ser. No. 325,190, Mar. 17, 1989, abandoned.

[30] Foreign Application Priority Data

Mar. 18, 1988 [JP] Japan .................. 63-66535

[51] Int. Cl.⁵ .................. G11C 7/00; G11C 29/00; G11C 17/00
[52] U.S. Cl. .................. 365/200; 365/94; 365/104; 365/230.03; 371/10.1
[58] Field of Search .................. 365/94, 96, 104, 200, 365/230.03; 371/10.1

[56] References Cited

U.S. PATENT DOCUMENTS

| | | | |
|---|---|---|---|
| 4,051,460 | 9/1977 | Yamada et al. | 371/10 X |
| 4,384,345 | 5/1983 | Mikome | 365/94 X |
| 4,385,368 | 5/1983 | Principi et al. | 365/96 X |
| 4,400,798 | 8/1983 | Francis et al. | 365/174 X |
| 4,422,161 | 12/1983 | Kressel et al. | 365/72 X |
| 4,493,075 | 1/1985 | Anderson et al. | 371/10 |
| 4,556,975 | 12/1985 | Smith et al. | 371/10 |
| 4,575,743 | 3/1986 | Hashimoto | 365/94 X |
| 4,592,024 | 5/1986 | Sakai et al. | 365/200 |
| 4,599,709 | 7/1986 | Clemons | 365/200 |
| 4,601,019 | 7/1986 | Shah et al. | 365/200 |
| 4,601,031 | 7/1986 | Walker et al. | 371/10 |
| 4,610,000 | 9/1986 | Lee | 365/104 |
| 4,648,075 | 3/1987 | Segawa et al. | 371/10 |
| 4,672,581 | 6/1987 | Waller | 365/200 |
| 4,675,849 | 6/1987 | Kinoshita | 365/200 |
| 4,725,980 | 2/1988 | Wakimoto et al. | 365/200 X |
| 4,727,516 | 2/1988 | Yoshida et al. | 365/200 |
| 4,807,191 | 2/1989 | Flannagan | 365/200 |
| 4,811,303 | 3/1989 | Hiroi | 365/94 |

FOREIGN PATENT DOCUMENTS

| | | |
|---|---|---|
| 0034070 | 8/1981 | European Pat. Off. |
| 0049629 | 4/1982 | European Pat. Off. |
| 0142127 | 5/1985 | European Pat. Off. |
| 0249903 | 12/1987 | European Pat. Off. |
| 3215121 | 11/1983 | Fed. Rep. of Germany |
| 2312837 | 12/1976 | France |
| 58-2943 | 1/1983 | Japan .................. 371/10 |
| 62-045059 | 2/1987 | Japan |
| 2129585A | 5/1984 | United Kingdom |

OTHER PUBLICATIONS

K. Takizawa et al., "Session XII: Gate and Programmable Logic Arrays, THPM 12.7: A 1Mb ROM with On--Chip ECC for Yield Enhancement," ISSCC 83, Feb. 24, 1983, pp. 158-159.

Primary Examiner—Joseph A. Popek
Assistant Examiner—Michael A. Whitfield

[57] ABSTRACT

A main memory cell array is divided into a plurality of blocks, and a spare memory cell group is arranged apart from the main memory cell array. The spare memory cell group uses bit lines or word lines different from those of the main memory cell array and includes spare memory cells which are different in structure from the memory cells of the main memory cell array. The number of the memory cells of the spare memory cell group is the same as that of the main memory cells of one row or column in each block of the main memory cell array, and data can be programmed into the spare memory cells after the completion of the manufacturing process. The operation of programming data into the spare memory cells of the spare memory cell array is effected by use of a write-in address buffer and a write-in decoder. When a row or column including a defective memory cell is designated in the main memory cell array, the row or column of the spare memory cells in the spare memory cell group is activated.

14 Claims, 4 Drawing Sheets

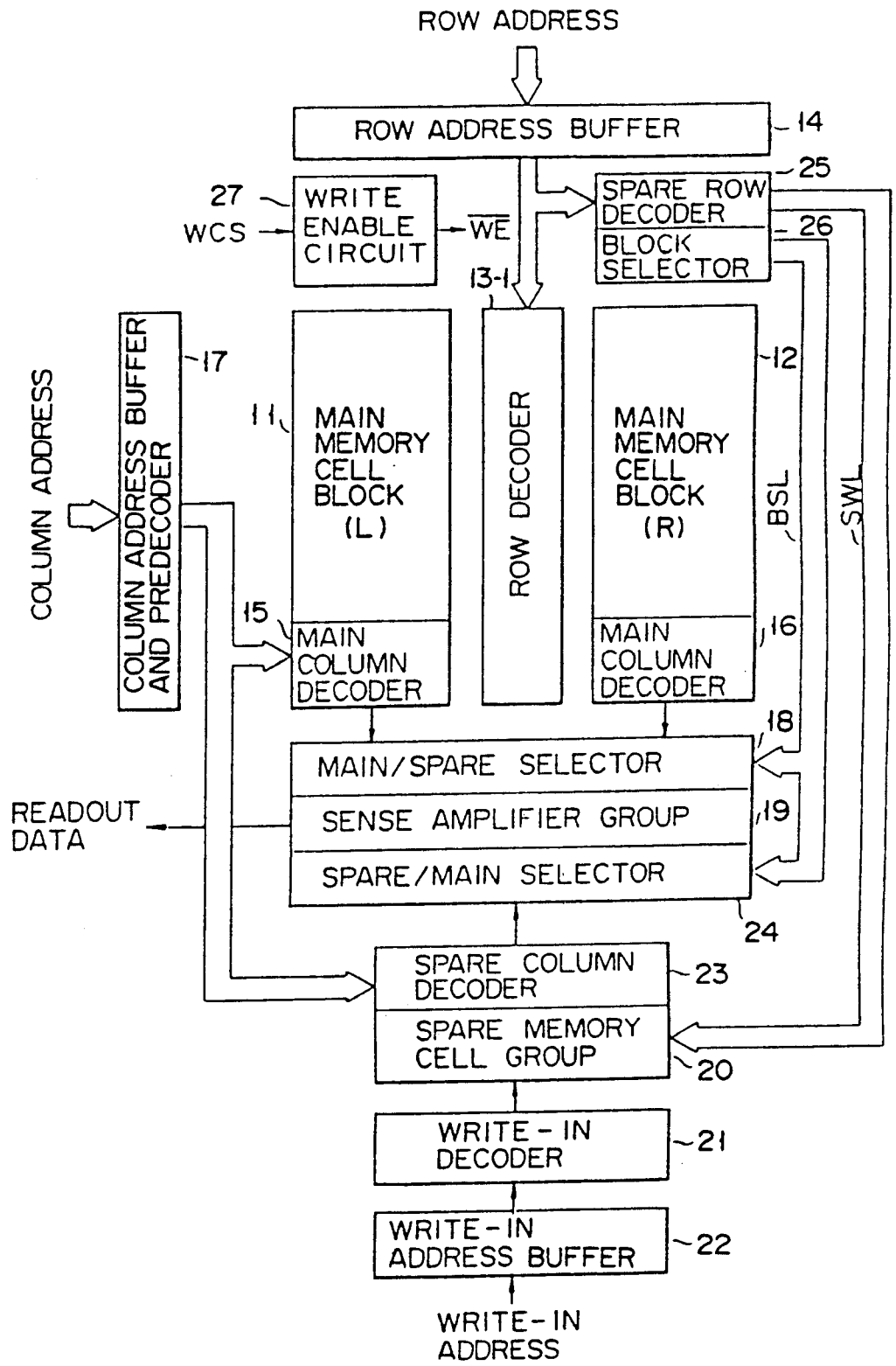
F I G. 1

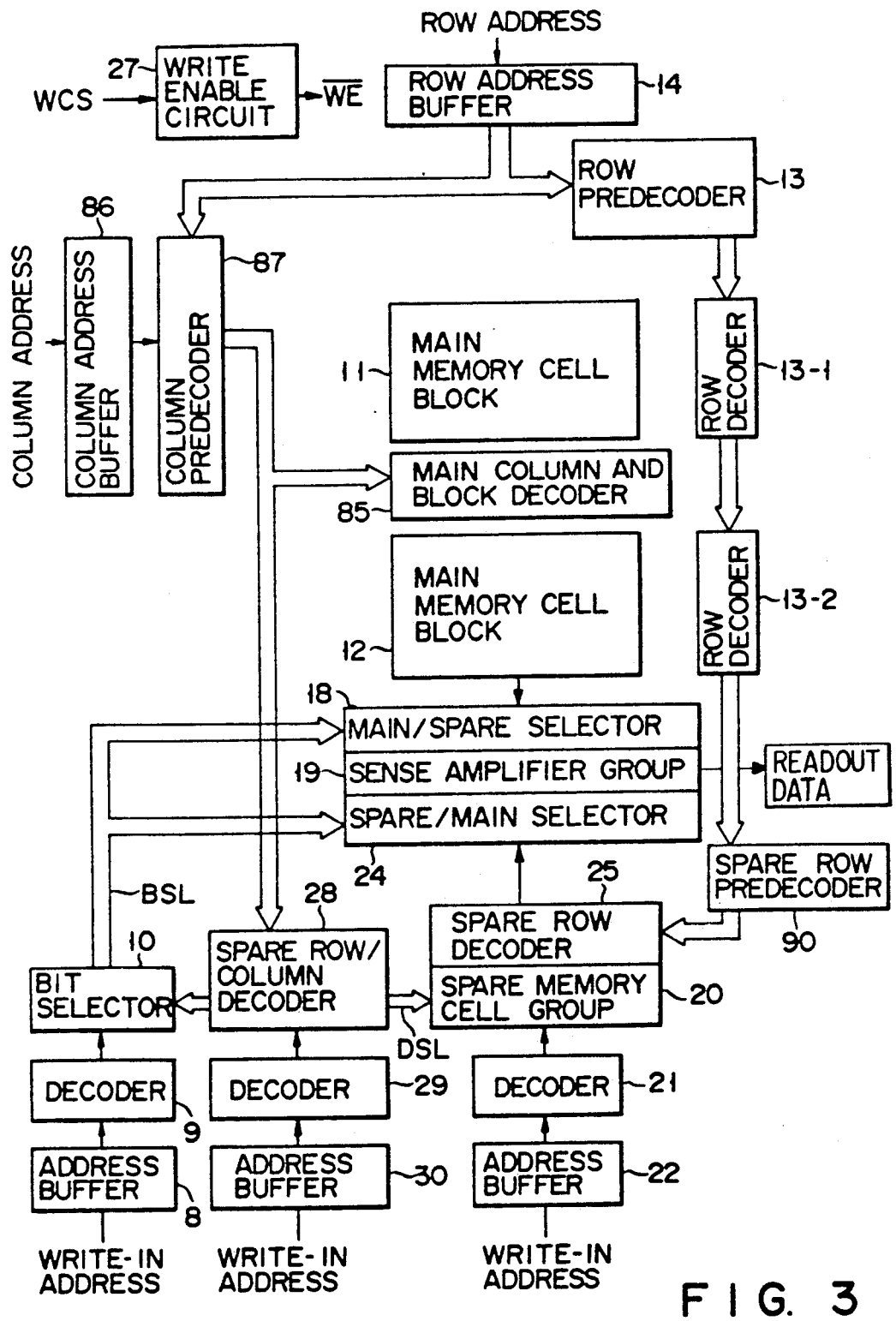
F I G. 3

MASK ROM WITH SPARE MEMORY CELLS

This application is a continuation, of application Ser. No. 07/545,114 filed Jun. 27, 1990 now abandoned, which is a continuation of application Ser. No. 07/325,190, filed Mar. 17, 1989, now abandoned.

BACKGROUND OF THE INVENTION

1. Field of the Invention

This invention relates to a mask ROM formed for improvement of the manufacturing yield, and more particularly to a mask ROM having spare memory cells.

2. Description of the Related Art

As the memory capacity of a random access memory (RAM) in which the data write-in and readout operation can be effected has increased, redundancy means for relieving defective cells has been used more frequently. In order to compensate for defective memory cells, spare memory cells, which are formed with the same structure as the main memory cells, are arranged in the same memory array as the main memory cells and are connected to bit lines to which the main memory cells are also connected. In a case where one or more main memory cells are detected to be defective, the spare memory cells are used instead of the defective main memory cells so as to enhance the manufacturing yield of the RAM.

In contrast, in a mask ROM, which can be programmed by use of a mask in the manufacturing process, it is generally considered impossible to provide spare memory cells with the same structure as the main memory cells and selectively use them instead of the main memory cells. However, as the memory capacity of the mask ROM increases, the manufacturing yield may be rapidly lowered in conjunction with an increase in the chip size and miniaturization of the elements. Thus, in the mask ROM, it is also necessary to take measures compensate for defective memory cells.

As the repairing measures for the mask ROM, a double cell method, error collecting code (ECC) method, fuse programming method, PROM method and the like have been proposed. However, when the chip size, operation speed and ease of the processing for the cost are considered, none of the above-described methods can be effectively realized and no redundancy means is generally used. For example, the fuse programming method is advantageous in the operation speed and the ease of the processing, and defective memory cells of several bits can be compensated for. However, in this case, a mask alignment error or patterning error may tend to occur with the miniaturization, thereby breaking or shorting the word lines or bit lines, and it is practically impossible to compensate for defective memory cells on the same rows or columns which may be caused by the breakage (cutoff) or short of the word lines or bit lines. In ROMs actually formed, defective memory cells may occur in the unit of row or column. That is, in a case where the word line or bit line is cut off, all the memory cells on the same row or column connected to the broken or cutoff word line or bit line become defective. Further, in a case where the word lines or bit lines are shorted, all the memory cells on the same rows or columns connected to at least two shorted word lines or bit lines become defective. As a result, a large number of spare memory cells are required, thereby increasing the chip size.

Thus, when an attempt is made, with the conventional mask ROM, to add the redundancy function to compensate for the defect or to intentionally rewrite the ROM data, the chip size will increase.

SUMMARY OF THE INVENTION

Accordingly, an object of this invention is to provide a mask ROM with which the defect compensation and the replacement of ROM data can be attained with a minimum increase in chip size.

According to one aspect of this invention, there is provided a mask ROM which comprises a main memory cell array; word lines arranged correspondingly to rows of memory cells in the main memory cell array; bit lines arranged correspondingly to columns of the memory cells in the main memory cell array; and spare memory cells which are formed with a structure different from that of the memory cells in the main memory cell array and do not commonly use the bit lines and word lines and in which data can be programmed after the completion of the manufacturing process.

Unlike the RAM, with the mask ROM, data cannot be replaced by that stored in a spare memory cell having the same structure and circuit as the main memory cell by utilizing the conventional technical knowledge because of the unique property of the mask ROM. However, it becomes possible to replace the ROM data by providing ROM data programmable spare memory cells having a different structure from that of the main memory cell. For example, the main memory cell is formed with the smallest possible pattern which can be obtained in the process. In this case, if the spare memory cell is formed with a pattern based on the same design rule as the main memory cell, the size of the pattern of the spare memory cell will become larger. Thus, the spare memory cell may be formed with a relatively large pattern and therefore occurrence of defect in the spare memory cell becomes small. At this time, it will be difficult to form the patterns if the main memory cell and the spare memory cell are formed to commonly use the bit line or word line. However, the pattern formation becomes possible by forming the main memory cells and the spare memory cells in different regions and separately providing the bit lines or word lines for the main memory cells and the spare memory cells, respectively.

BRIEF DESCRIPTION OF THE DRAWINGS

FIG. 1 is a block diagram showing the entire circuit construction of a mask ROM according to one embodiment of this invention;

FIG. 3 is a block diagram showing the entire circuit construction of a mask ROM according to another embodiment of this invention.

DETAILED DESCRIPTION OF THE PREFERRED EMBODIMENTS

Figure 2:
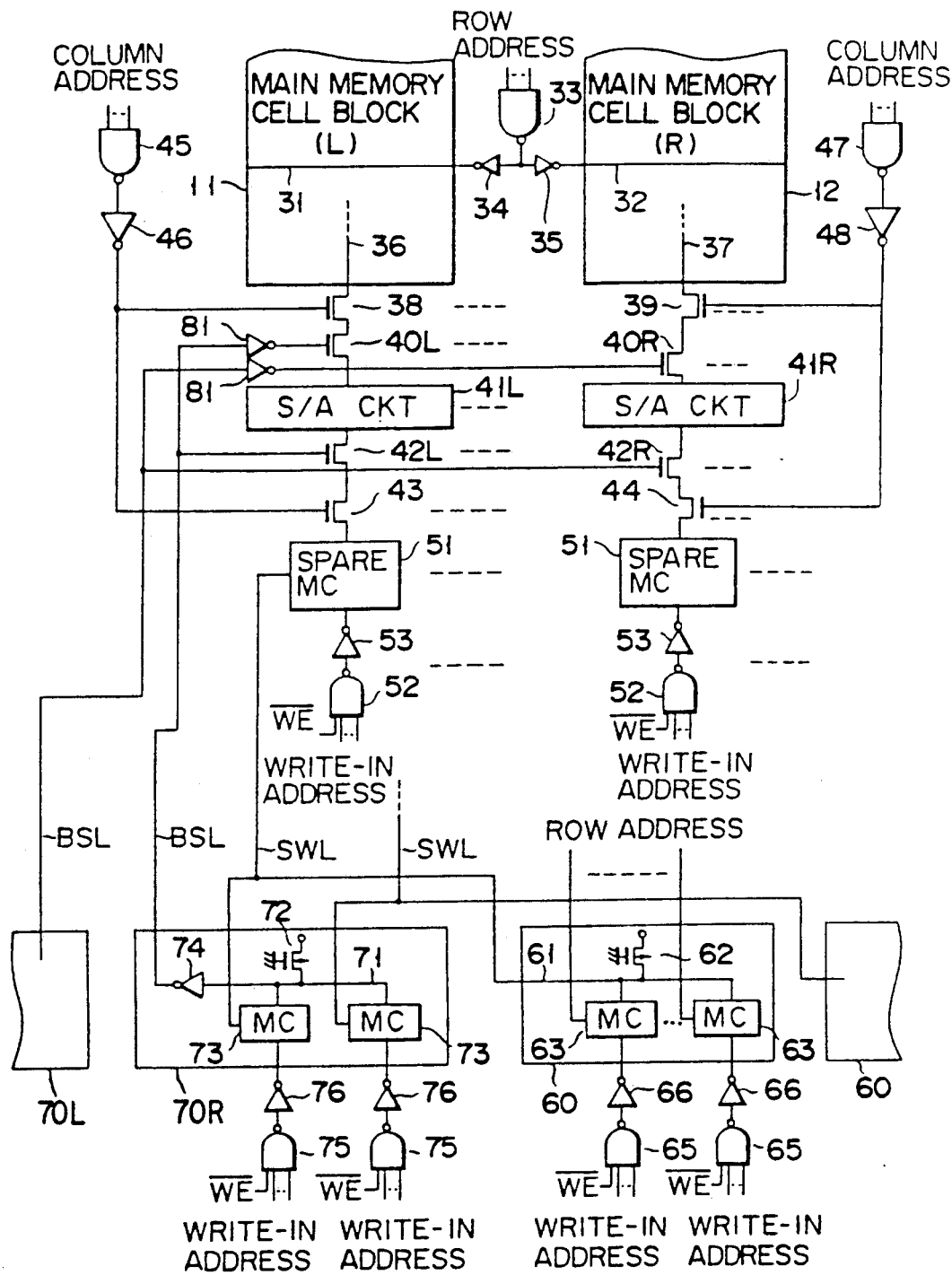
FIG. 2 is a circuit diagram showing the detail construction of main portions of the circuit shown in FIG. 1.

FIG. 1 is a block diagram showing the entire circuit construction of a NOR type mask ROM according to one embodiment of this invention. In the mask ROM of this invention, a main memory cell array having a plurality of mask ROM cells therein is divided into a plurality of blocks in the word line direction. In this example, main memory cell array is divided into two blocks 11 and 12 in the word line direction.

Main memory cells are arranged in a matrix form in each of main memory cell blocks 11 and 12. The main memory cells arranged on the same row are connected to a corresponding one of word lines and the main memory cells arranged on the same column are connected to a corresponding one of bit lines. Word lines on the corresponding rows in main memory blocks 11 and 12 are selectively driven in parallel by means of row decoder 13. The output of row address buffer 14 which is supplied with an row address is supplied to row decoder 13. The bit lines in main memory cell blocks 11 and 12 are selected by means of main column decoders 15 and 16. The output of column address buffer and predecoder 17 which is supplied with a column address, is supplied in parallel to main column decoders 15 and 16. One of the main memory cells in corresponding columns of main memory cell blocks 11 and 12 is selected according to the decoded outputs of row decoder 13-1 and main column decoders 15 and 16.

Main/spare selector 18 is connected to main column decoders 15 and 16. The memory data of a main memory cell selected by main column decoders 15 and 16 are supplied to sense amplifier group 19 having a plurality of sense amplifier circuits via selector 18.

Spare memory cells of the same number of main memory cells of each row in main memory cell blocks 11 and 12 are arranged on each of a plurality of rows in spare memory cell group 20. The spare memory cells may be PROMs or fuses into which given ROM data can be programmed. ROM data programming with respect to the memory cells in spare memory cell group 20 is effected by use of the output of programming decoder 21. Programming decoder 21 is supplied with the output of write-in address buffer 22, which is supplied with a write-in address. ROM data programmed into the memory cells of spare memory cell group 20 can be selected for each row according to a signal of spare row line SWL. One bit included in ROM data of the spare memory cells of a selected row is selected for each output bit by means of spare column decoder 23 which is supplied with the output of column address buffer and predecoder 17. Spare column decoder 23 is also connected to spare/main selector 24, and one-bit data from one of the spare memory cells in spare memory cell group 20 selected for each output bit by spare column decoder 23 is supplied to sense amplifier group 19 via selector 24. The operation of spare/main selector 24 and main/spare selector 18 is controlled by a signal of block selector signal line BSL. Data read out from a main memory cell in main memory cell blocks 11 and 12 or a spare memory cell or spare memory cell group 20 is output via sense amplifier group 19.

Spare row decoder 25 is supplied with the output of row address buffer 14. Programmable elements such as PROMs or fuses in which information can be programmed are arranged in spare row decoder 25. That part of the ROM data which is to be replaced or defective row addresses are written into the programmable elements. Spare row decoder 25 compares the previously programmed defective row address with the output row address of row address buffer 14, and supplies an output signal for selecting the row in spare memory cell group 20 to spare row line SWL based on the comparison result.

Block selector 26 is supplied with a decoded output of spare row decoder 25. Information programmable elements are also arranged in block selector 26, and address information for identifying either one of main memory cell blocks 11 and 12 is programmed into the programmable elements. The data output from spare row decoder 25 is written into block selector 26. Selector 26 compares this data with the input address information, and generates a signal for controlling main/spare selector 18 and spare/main selector 24 from the results of the comparison. The output signal of selector 26 is supplied to block selector signal line BSL.

Write enable circuit 27 is operated in response to write-in control signal WCS supplied from the exterior of the device. When write-in control signal WCS is supplied, write enable circuit 27 outputs signal WE which permits data or address to be programmed into the spare memory cell of spare memory cell group 20, memory cell of spare row decoder 25 and memory cell of block selector 26.

When the mask ROM of the above construction is found to contain at least one defective memory cell as the result of function test effected after the completion of the manufacturing process, or when part of the data stored in the mask ROM needs to be altered, write-in control signal WCS is supplied from the exterior to operate write enable circuit 27. It should be noted that the defective memory cells may include not only main memory cells which are themselves defective but also main memory cells which are connected to broken or cutoff word lines, for example. Output signal $\overline{WE}$ of write enable circuit 27 permits data or address to be programmed into the spare memory cell of spare memory cell group 20, programmable element of spare row decoder 25 and programmable element of block selector 26. In this condition, a row address designating the defective main memory cells of one row is programmed into spare row decoder 25, and data indicating that one of main memory cell blocks 11 and 12 which contains the defective memory cells is programmed into block selector 26. Then, the write-in address is supplied to write-in address buffer 22, decoded by write-in decoder 21, and supplied to spare memory cell group 20. In this condition, correct data to be stored in the defective main memory cells of one row are programmed into the spare memory cells of one row in spare memory cell group 20.

In the data readout mode, row and column addresses are supplied. One main memory cell is selected for each output bit in a row of main memory cell blocks 11 and 12 by means of row decoder 13-1 and main column decoders 15 and 16 according to the input addresses. The memory data of the selected main memory cell is supplied to main/spare selector 18.

If, in this case, the input row address does not correspond to the defective row of main memory cells, that is, if the main memory cell row including the selected cell is normal, main/spare selector 18 is operated by the output of block selector 26, and the readout ROM data from the selected cell is input to sense amplifier group 19. After this, ROM data amplified by sense amplifier group 19 is output to the exterior.

In contrast, if the input row address corresponds to the defective row of main memory cells, that is, if the main memory cell row including the selected cell is defective, then a corresponding one row of spare memory cells in spare memory cell group 20 is selected by the decoded output of spare row decoder 25 and correct ROM data of the selected row of spare memory cells is supplied to spare column decoder 23. Spare column decoder 23 selects a bit corresponding to the column address input from the ROM data of one row, and supplies the selected bit to spare/main selector 24. At this time, main/spare selector 18 is set non-operative and spare/main selector 24 is set operative by the present output of block selector 26. As a result, data of the bit selected by spare column decoder 23 is supplied from spare/main selector 24 to sense amplifier group 19 instead of ROM data stored in the defective main memory cell of the main memory cell array, and then the correct ROM data can be supplied to the exterior.

With this construction in which the main memory cell array is divided into two main memory cell blocks 11 and 12, it is only necessary to use spare memory cells corresponding in number to the main memory cells of one or more rows of main memory cell blocks 11 and 12. As a result, an increase in the chip size can be suppressed to a minimum even if the redundancy function is added. This effect can be further enhanced by appropriately selecting the number of blocks into which the main memory cell array is divided and the occupied area of row decoder 13-1.

FIG. 2 is a circuit diagram showing the detailed construction of main portions of the mask ROM according to the first embodiment shown in FIG. 1. In FIG. 2, the same portions as those shown in FIG. 1 are denoted by the same reference numerals. Word lines 31 and 32 are respectively arranged in main memory cell blocks 11 and 12. The decoded output of each of NAND gates 33 is supplied to corresponding word lines 31 and 32 via inverters 34 and 35, respectively. Each NAND gate 33 is a decoding portion for one of the rows in row decoder 13-1 and is supplied with the row address. Inverters 34 and 35 function as buffers for supplying the decoded output of NAND gate 33 to word lines 31 and 32. Bit lines 36 and 37 are respectively arranged in main memory cell blocks 11 and 12. One end of the current path of each of decoding transistors 38 arranged in main column decoder 15 is connected to corresponding bit line 36, and one end of the current path of each of decoding transistors 39 arranged in main column decoder 16 is connected to corresponding bit line 37. One end of the current path of each of selection transistors 40L arranged in main/spare selector 18 is connected to the other end of the current path of a corresponding one of decoding transistors 38, and one end of the current path of each of selection transistors 40R arranged in main/spare selector 18 is connected to the other end of the current path of a corresponding one of decoding transistors 39. The other end of the current path of each selection transistor 40L is connected to sense amplifier circuit 41L provided in sense amplifier group 19, and the other end of the current path of each selection transistor 40R is connected to sense amplifier circuit 41R provided in sense amplifier group 19. Also, sense amplifier circuit 41L is connected to one end of the current path of each of selection transistors 42L provided in spare/main selector 24, and sense amplifier circuit 41R is connected to one end of the current path of each of selection transistors 42R provided in spare/main selector 24. The other end of the current path of each selection transistor 42L is connected to one end of the current path of a corresponding one of decoding transistors 43 arranged in spare column decoder 23, and the other end of the current path of each selection transistor 42R is connected to one end of the current path of a corresponding one of decoding transistors 44 arranged in spare column decoder 23. NAND gates 45 and 47 acting as predecoders in column address buffer and predecoder 17 are supplied with the column address input. The decoded output of each NAND gate 45 is supplied to the gates of corresponding transistors 38 and 43 via inverter 46 acting as a buffer, and the decoded output of each NAND gate 47 is supplied to the gates of corresponding transistors 39 and 44 via inverter 48 acting as a buffer.

Spare memory cells 51 of a plurality of rows are arranged in spare memory cell group 20. Spare memory cells 51 in each row are selected by signals of corresponding spare row lines SWL. The ROM data write-in operations for spare memory cells 51 is respectively effected by the outputs supplied from NAND gates 52 constituting partial decoders in write-in decoder 21 via inverters 53 acting as a buffer. NAND gates 52 is supplied with write enable signal $\overline{WE}$ from write enable circuit 27. Spare memory cells 51 are respectively connected to the other ends of the current paths of corresponding transistors 43 and 44. With this connection, ROM data from spare memory cells 51 can be selectively supplied to sense amplifier circuits 41L and 41R via decoding transistors 43 and 44 and selection transistors 42L and 42R, respectively.

A plurality of partial decoders 60 are arranged in spare row decoder 25. As shown in FIG. 2, each of partial decoders 60 includes load P-channel MOS transistor 62 connected to output node 61 and a plurality of programmable elements 63. The potential of output node 61 is supplied to a corresponding one of spare row lines SWL and to block selector 26. The operation of writing address information into programmable elements 63 in partial decoder 60 is effected in response to the outputs of NAND gates 65 via respective inverters 66 acting as a buffer. NAND gates 65 are each supplied with a write-in address and write enable signal $\overline{WE}$ from write enable circuit 27.

A plurality of partial decoders 70 are arranged in block selector 26. Each partial selector 70 includes load P-channel MOS transistor 72 connected to output node 71, a plurality of programmable elements 73, and inverter 74 connected to output node 71. The output of inverter 74 in each partial decoder 70 is supplied to a corresponding one of block selector signal lines BSL. The signals of block selector signal lines BSL are supplied directly to the gates of respective transistors 42L and 42R of spare/main selector 24 and to the gates of transistor 40L and 40R of main/spare selector 18 via respective inverters 81. Further, the operation of writing address information into programmable elements 73 arranged in partial decoder 70 is effected in response to the outputs of NAND gates 75 supplied via respective inverters 76 acting as a buffer. Each NAND gate 75 is supplied with a write-in address and write enable signal WE generated from write enable circuit 27. In FIG. 2, transistors whose channel type is not specified are of N-channel type.

With this construction, when spare memory cells 51, programmable elements 63 in spare row decoder 25 and programmable elements 73 in block selector 26 are programmed, write enable signal $\overline{WE}$ of "1" level is supplied to NAND gates 52, 65 and 75. If, at this time, the logic conditions of the addresses supplied to NAND gates 52, 65 and 75 are satisfied and the outputs thereof become "0" level, the outputs of inverters 53, 66 and 76 acting as buffers to which the outputs of the NAND gates are supplied become "1" level. As a result, "1" level data is programmed into a corresponding one of the memory cells. In this condition, a row address input is supplied to spare row decoder 25. Assume now that the row address input coincides with the row address previously programmed and the decoded output of one of partial decoders 60 in spare row decoder 25 has become "1" level. Then, spare memory cells 51 of one row are selected by a signal of a corresponding one of spare word lines SWL, and the previously programmed ROM data is read out from each spare memory cell 51.

The signal of spare word line SWL is also supplied to a corresponding one of partial decoders 70R and 70L of block selector 26. The output of partial decoder 70R of block selector 26 supplied with the signal of spare word line SWL also becomes "1" level, and the decoded output is supplied to turn on a corresponding one of transistors 42L of spare/main selector 24 and turn off a corresponding one of transistors 40L of main/spare selector 18. In this case, data of corresponding spare memory cell 51 is supplied instead of ROM cell data of main memory cell block 11 to sense amplifier circuit 41L via transistor 43 of spare column decoder 23 and transistor 42L of spare/main selector 24. Thus, main memory cells connected to a defective word line in main memory cell block 11 can be compensated for.

In contrast, in a case where a defective word line is present in main memory cell block 12, the output of partial decoder 70R in block selector 26 becomes "1" level. Then, the output is supplied to turn on a corresponding one of transistors 42R of spare/main selector 24 and turn off a corresponding one of transistors 40R of main/spare selector 18. As a result, data of spare memory cell 51 is supplied instead of main memory cell data of main memory cell block 12 to sense amplifier circuit 41R via transistor 44 of spare column decoder 23 and transistor 42R of spare/main selector 24.

With this construction, the main memory cell array is divided into two blocks and the number of main memory cells connected to each word line is reduced. Therefore, the number of spare memory cells connected to the same word line of spare memory cell group 20 for compensating for defective memory cells can be reduced. As a result, an increase in the chip size can be suppressed to a minimum even if the redundancy function is added.

In the above embodiment, the main memory cell array is divided into two blocks, but can be divided into three or more blocks. An increase in the number of divided blocks allows the number of spare memory cells connected to the same word line in spare memory cell group 20 to be reduced, thus suppressing the increase in the chip size to a minimum. In addition, when two word lines are shorted, spare memory cells of two rows in spare memory cell group 20 are used instead of the memory cells connected to the shorted word lines in order to compensate for the defective rows.

Figure 4:
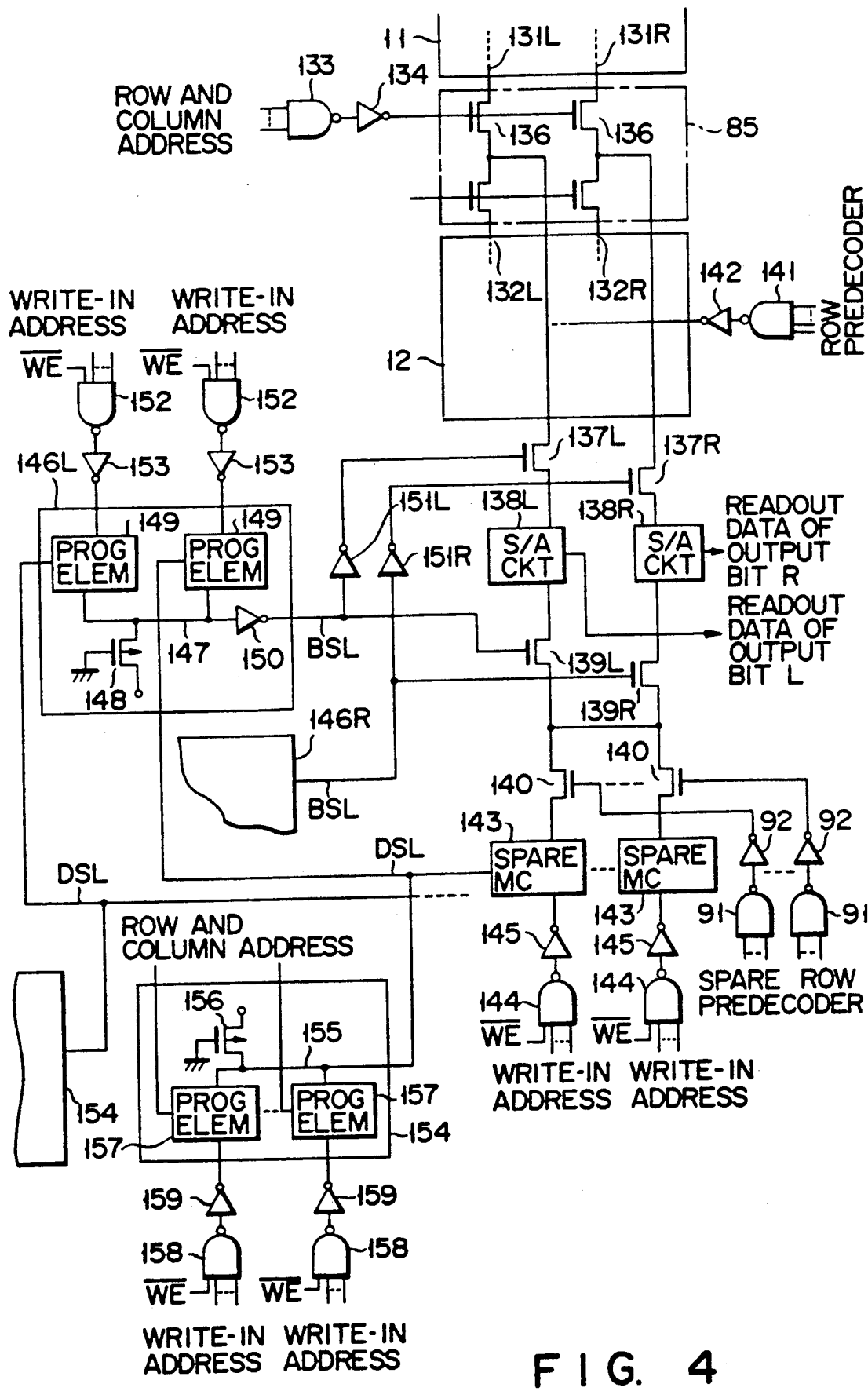
FIG. 4 is a circuit diagram showing the detail construction of a main portion of the circuit shown in FIG. 3.

FIG. 3 shows the entire circuit construction of a mask ROM according to another embodiment of this invention, and FIG. 4 shows main portions of the circuit of FIG. 3. In the circuit of FIGS. 1 and 2, the main memory cell array is divided into a plurality of (two) blocks in a row direction, and spare memory cells can be easily replaced by the main memory cells in order to compensate for the defective memory cells caused by the defective word line or lines. However, in the NOR type or NAND type mask ROM, bit lines may be cut off or shorted.

In order to deal with the problem caused by the bit lines which are cut off or shorted, the main memory cell array in the circuit of FIGS. 3 and 4 is divided into a plurality of (two) blocks in a bit line direction so that two divided main memory cell arrays can be obtained.

In FIG. 3, the same portions as those in FIG. 1 are denoted by the same reference numerals. In each of two main memory cell blocks 11 and 12, main memory cells (not shown) are arranged in a matrix form. A plurality of main memory cells arranged on the same row in each block are connected to the same word line (not shown), and a plurality of main memory cells arranged on the same column are connected to the same bit line (not shown). Word lines (not shown) are selectively driven by row decoders 13-1 and 13-2. Row decoders 13-1 and 13-2 are supplied with the output of row predecoder 13 to which an output of row address buffer 14 is supplied. Row address is supplied to a row address buffer 14. The bit lines (not shown) of main memory cell blocks 11 and 12 are selected by main column and block decoder 85 disposed between main memory cell blocks 11 and 12. The column and block decoder 85 is used to determine whether the upper block (main memory cell block 11) or the lower block (main memory cell block 12) should be selected, or determine which columns of memory cells should be selected to bits from the memory cells of these columns. Main column and block decoder 85 is supplied with the output of column predecoder 87 to which an output of column address buffer 86 and an output of row address buffer 14 are supplied. A column address is supplied to a column address buffer 86. One of the output bits of the main memory cells in a selected one of main memory cell blocks 11 and 12 is selected according to the decoded outputs of row decoders 13-1 and 13-2 and main column and block decoder 85.

The memory data of the main memory cell selected by means of main column and block decoder 85 is supplied to sense amplifier group 19 having a plurality of sense amplifier circuits via main/spare selector 18.

Spare memory cell group 20 has a spare memory cells such as PROM spare cells or fuses in which information can be programmed. The number of the spare memory cells of each column is the same as that of the main memory cells of each column in main memory cell blocks 11 and 12. The operation of programming ROM data into each spare memory cell of spare memory cell group 20 is effected in response to the output of write-in decoder 21. Write-in decoder 21 is supplied with the output of write-in address buffer 22 to which a write-in address is supplied. Data programmed in the spare memory cells of spare memory cell group 20 is selected for each row in response to a signal of data line selector line DSL connected to spare row/column decoder 28. Spare row/column decoder 28 has programmable elements in which information can be programmed and to which the output of write-in decoder 29 is supplied. Write-in decoder 29 is supplied with the output of write-in address buffer 30 to which column address information corresponding to the defective column indicating address is supplied. An output of the row predecoder 13 is supplied to a spare predecoder 90 through row decoders 13-1 and 13-2. An output of the spare predecoder 90 is supplied to the spare row decoder 25. The spare row decoder 25 selects one bit from the correct ROM data of the spare memory cells of one column selected in spare memory cell group 20. Spare row decoder 25 is connected to spare/main selector 24, and correct ROM data of one bit in spare memory cell group 20 corresponding to a column selected by spare row/column decoder 28 is supplied to sense amplifier group 19 via selector 24. The operation of spare/main selector 24 and main/spare selector 18 is controlled by a signal of bit selector signal line BSL.

Bit selector 10 is supplied with the output of spare row/column decoder 28. Also, programmable elements in which information be programmed are arranged in bit selector 10. Data designating one or main memory cell blocks 11 and 12 is programmed into the programmable elements by means of write-in decoder 9 and write-in address buffer 8. The data output from spare row/column detector 28 is written into bit selector 10. Selector 10 compares this data with the input address information, and generates a signal for controlling main/spare selector 18 and spare/main selector 24 from the results of the comparison. The output signal of selector 10 is supplied to bit selector signal line BSL.

Write enable circuit 27 generates, in response to externally supplied write-in control signal WCS, signal $\overline{WE}$ which permits ROM data or addresses to be programmed into spare memory cells of spare memory cell group 20, programmable elements of spare row/column decoder 28 and programmable elements of bit selector 10.

If the mask ROM of the above construction is found to contain at least one defective memory cell after the completion of the manufacturing process, write-in control signal WCS is supplied from the exterior to operate write enable circuit 27. As a result, the spare memory cells in spare memory cell group 20, programmable elements in spare row/column decoder 28 and programmable elements in bit selector 10 are set into an operative condition in which ROM data or addresses can be programmed. The defective main memory cells may include not only main memory cells which are themselves damaged but also main memory cells connected to broken or cutoff bit lines, for example. In this condition, a row and column address designating the row and column of defective main memory cells are programmed into spare row/column decoder 28 and output bit address information indicating that one of main memory cell blocks 11 and 12 which contains the defective main memory cells is programmed into bit selector 10.

In the ROM data readout mode, row and column addresses are supplied. One main memory cell is selected for each output bit in a column of main memory cell blocks 11 and 12 by means of row decoders 13-1, 13-2 and main column and block decoder 85 according to the input addresses. The memory data of the selected main memory cell is supplied to main/spare selector 18.

If, in this case, the input column and row addresses do not correspond to the defective column of main memory cells, that is, if the main memory cell column including the selected cell is normal, main/spare selector 18 is operated by the output of bit selector 10, and the readout ROM data from the selected cell is input to sense amplifier group 19. After this, the readout ROM data is output to the exterior.

In contrast, if the input column and row addresses correspond to the column of defective main memory cells, that is, if the main memory cell column including the selected cell is defective, then a corresponding one column of spare memory cells in spare memory cell group 20 is selected by the decoded output of spare row/column decoder 28 and the address information of the column of spare memory cells is supplied to spare row decoder 25 via spare row predecoder 90 and spare row predecoder 90 is supplied to output of row predecoder 13. Spare row decoder 25 selects a bit of the row address input from the address information of one column, and supplies the selected bit to spare/main selector 24. At this time, main/spare selector 18 is set nonoperative and spare/main selector 24 is set operative by the present output of bit selector 10. As a result, data of the bit selected by spare row decoder 25 is supplied from spare/main selector 24 to sense amplifier group 19 instead of ROM data stored in the defective main memory cells of the main memory cell array, and then the correct ROM data can be supplied to the exterior.

With this construction in which the main memory cell array is divided into two main memory cell blocks 11 and 12, it is only necessary to use spare memory cells corresponding in number to the main memory cells of one or more columns of main memory cell blocks 11 and 12. As a result, an increase in the chip size can be suppressed to a minimum even if the redundancy function is added. This effect can be further enhanced by appropriately selecting the number of blocks into which the main memory cell array is divided and the occupied areas of row decoders 13-1, 13-2 and main column and block decoder 85.

FIG. 4 is a circuit diagram showing the detail construction of main portions of the mask ROM shown in FIG. 3. Bit lines 131L and 131R are respectively arranged in main memory cell block 11 and bit lines 132L and 132R are respectively arranged in main memory cell block 12. NAND gate 133 functioning as a decoder portion for one column in main column and block decoder 85 is supplied with the most significant bit of the row address and the column address. The predecoded output of NAND gate 133 is supplied to the gates of transistors 136 constituting main column and block decoder 85 via inverter 134 acting as a buffer. Selection transistors 136 are arranged in main column and block decoder 85. The current path of each of transistors 136 is connected at one end to a corresponding one of the output terminals of main column and block decoder 85. Sense amplifier circuits 138L and 138R are disposed in sense amplifier group 19 and connected to the other ends of the current paths of transistors 137L and 137R, respectively. Selection transistors 137L and 137R are arranged in main/spare selector 18. Selection transistors 139L and 139R are arranged in spare/main selector 24, and the current paths thereof are connected at one end to respective sense amplifier circuits 138L and 138R. Decoding transistors 140 are arranged in spare row decoder 25, and the current paths thereof are connected at one end to the other ends of the current paths of transistors 139L and 139R, respectively outputs of spare row predecoder 90 are supplied with respective gates of decoding transistors 140. Spare row predecoder 90 is composed of invertor 92 and NAND decoder 91. NAND decoder 91 is supplied with the output of row predecoder 13. Invertor 92 is a buffer that is supplied with the output of NAND decoder 91. NAND gates 141 are decoders in row decoder 13-1 and 13-2. Inverters 142 acting as buffers are supplied with respective decoded outputs of NAND gates 141, and the outputs of inverters 142 are supplied to the respective bit lines.

A plurality of columns of spare memory cells 143 are arranged in spare memory cell group 20. The operation of programming data into spare memory cells 143 is effected in response to the outputs supplied from partial decoders or NAND gates 144 arranged in write-in decoder 21 via respective inverters 145. Data of each spare memory cell 143 is selectively supplied to a corresponding one of sense amplifier circuits 138L and 138R via transistors 140, 139L and 139R. Each NAND gate 144 is supplied with a corresponding write-in address and write enable signal $\overline{WE}$ output from write enable circuit 27.

A plurality of partial decoders 146L, 146R are arranged in bit selector 10. Each partial decoder 146L, 146R includes load P-channel MOS transistor 148 connected to node 147, a plurality of programmable elements 149, and inverter 150 whose input terminal is connected to node 147. The output of inverter 150 of each partial decoder 146L, 146R are output to a corresponding one of bit selector signal lines BSL. A signal of each bit selector signal line BSL is supplied directly to the gate of a corresponding one of transistors 139L, 139R in spare/main selector 24 and to the gate of a corresponding one of transistors 137L, 137R in main/spare selector 18 via inverter 151L, 151R. The operation of programming information into each programmable elements 149 of partial decoder 146R is effected in response to the output of a corresponding one of NAND gates 152 supplied via inverters 153 acting as a buffer. Each NAND gate 152 is supplied with a write address and write enable signal $\overline{WE}$ from write enable circuit 27.

A plurality of partial decoders 154 are provided in spare row/column decoder 28. As shown in FIG. 4, each partial decoder 154 includes load P-channel MOS transistor 156 connected to output node 155 and a plurality of programmable elements 157. The potential of output node 155 is supplied to corresponding data line selector line DSL and bit selector 10. The operation of programming data into each programmable element 157 of partial decoder 154 is effected by use of the output of a corresponding one of NAND gates 158 which is supplied via inverter 159 acting as a buffer. Each NAND gate 158 is supplied with a write address and write enable signal $\overline{WE}$ form write enable circuit 27. In FIG. 4, transistors whose channel type is not specified are of N-channel type.

With this construction, when data is programmed into each spare memory cell 143, programmable element 157 in spare row/column decoder 28 and programmable element 149 in bit selector 10, write enable signal $\overline{WE}$ of "1" level is supplied to NAND gates 144, 158 and 152. When the logic conditions of addresses supplied to NAND gates 144, 158 and 152 are satisfied and the outputs thereof are set to "0" level, the outputs of inverters 145, 159 and 153 acting as buffers to which the outputs of the respective NAND gates are supplied are set to "1" level. Thus, data of "1" level, for example, is programmed into a corresponding memory cell. In this condition, a row address (the most significant bit thereof, for example) and a column address are supplied to spare row/column decoder 28. The row address is used to select the upper or lower block, and the column address is used to select one of the columns. Assume now that the most significant bit of the input row address coincides with the previously programmed data, the input column and row addresses coincide with the previously programmed column and row addresses and the decoded output of one of partial decoders 154 in spare row/column decoder 28 is at "1" level. Then, a column of spare memory cells 143 is selected by a signal of a corresponding one of data line selector lines DSL so that previously programmed ROM data can be read out from each spare memory cell 143.

A signal of data line selector signal line DSL is also supplied to partial decoders 146L and 146R of bit selector 10. When a defect occurs in bit line 132L (output bit L) of the main memory cell block, or if it is required to replace ROM data, the decoded output of partial decoder 146L of bit selector 10 which is supplied with signals of a plurality of data selector signal lines DLS becomes "1" level. As a result, transistor 139L of spare/main selector 24 which is supplied with the decoded output is turned on and transistor 137L of main/spare selector 18 is turned off. Further, the decoded output of partial decoder 146R of bit selector 10 becomes "0" level, and as a result, transistor 139R of spare/main selector 24 which is supplied with the decoded output is turned off and transistor 137R of main/spare selector 18 is turned on. That is, in this case, instead of ROM data of the main memory cells of one column on bit line 132L on the side of output bit L, ROM data of spare memory cells 143 is supplied to sense amplifier circuit 138L via transistor 140 of spare row decoder 25 and transistor 139L of spare/main selector 24 in this order. Thus, the main memory cells connected to the defective bit line of the main memory cell array can be compensated for or ROM data can be replaced.

In contrast, when a defect occurs in bit line 132R (output bit R) of the main memory cell block, or if it is required to replace ROM data, the decoded output of partial decoder 146R of bit selector 10 becomes "1" level. As a result, transistor 139R of spare/main selector 24 which is supplied with the decoded output is turned on and transistor 137R of main/spare selector 18 is turned off. Further, the decoded output of partial decoder 146L of bit selector 10 becomes "0" level, and as a result, transistor 139L of spare/main selector 24 which is supplied with the decoded output is turned off and transistor 137L of main/spare selector 18 is turned on. That is, in this case, instead of ROM data of the main memory cells of one column connected to bit line 132R in the main cell block, ROM data of spare memory cells 143 is supplied to sense amplifier circuit 138R via transistor 140 of spare row decoder 25 and transistor 139R of spare/main selector 24 in this order.

In the above embodiments, the defective memory cells caused by the damaged memory cell or cutoff bit line are compensated for. However, in a case where bit lines are shorted or connected together, spare memory cells of two columns or corresponding number of columns in spare memory cell group 20 may be used instead of the defective memory cell columns. The above description is limited to the measures taken in the case where at least one cell of the main memory is found to be defective. Nonetheless, the present invention can apply to the case where part of the data stored in the ROM needs to be altered even if no memory cells have been found to be defective. Further, according to the invention, the data stored in a certain storage area of the main memory can be altered at once by simultaneously selecting the rows and columns of cells, which define that area, by means of the bit selector and the block selector. Further, this invention is not limited to the above embodiments and can be variously modified. For example, in the above embodiments, the main memory cell array is divided into two block, but it can be divided into three or more blocks. As the number of divided blocks increases, the number of spare memory cells of each column in spare memory cell group 20 can be further reduced, preventing the chip size from increasing.

What is claimed is:

1. A mask ROM, comprising:
   a main memory cell array in which a plurality of ROM cells for storing data using a mask are arranged in an m (rows)×n (columns) matrix, said main memory cell array including word lines, where each word line is connected to one ROM cell row, and bit lines, and each bit line is connected to one ROM cell column, each of said rows of ROM cells being divided into a plurality of i blocks (where i corresponds to an integral number and $2<=i<=n/2$), to thereby divide said main memory cell array into i blocks along a row direction, all of the n ROM cells which are connected to the plurality of i blocks of a row being selected by same respective one of row addresses,
   at least one row of a spare memory cell group in which data can be electrically written, a number of spare memory cells in said spare memory cell group being equal to n/i;
   data writing means for, if a ROM cell in any block of said main memory cell array becomes defective, writing into said spare memory cell group correct data associated with the block of the ROM cell row that includes a defective ROM cell;
   block storing means for storing data identifying the block including said defective ROM cell;
   address storing means for storing an address of the ROM cell row including said defective ROM cell; and
   read-out data selecting means for comparing, while in a ROM data read-out mode, an input address with the address stored in said address storing means, for selecting ROM cells in said main memory cell array when the input address and the address stored in said address storing means differ from each other, and for selecting said spare memory cell group in place of one block of a ROM cell row, said one block of said ROM cell row including said defective ROM cell and said ROM cell row containing one of the plurality of i blocks of a row, when the input address and the address stored in said address storing means are identical, and reading out the data from one of said ROM cells and a spare memory cell, in accordance with the input address and the address stored in the address storing means.

2. A mask ROM according to claim 1, wherein said block storing means includes a block selector.

3. A mask ROM according to claim 2, wherein said block selector includes a plurality of partial decoders for decoding write-in addresses, and programmable elements, controlled by outputs from the plurality of partial decoders, for storing the data associated with the one block including the defective ROM cell.

4. A mask ROM according to claim 1, wherein said address storing means includes a spare row decoder and spare column decoder.

5. A mask ROM according to claim 4, wherein said spare row decoder includes a plurality of partial decoders for decoding a plurality of write-in addresses and outputting a plurality of decoded write-in addresses, and programmable elements, controlled by the plurality of decoded write-in addresses from the plurality of partial decoders, for storing row addresses including an address of said defective ROM cell, and said spare column decoder includes a plurality of MOS transistors controlled by a plurality of signals each obtained by decoding a column address signal.

6. A mask ROM according to claim 1, wherein said read-out data selecting means includes a main/spare selector and spare/main selector.

7. A mask ROM according to claim 1, wherein said data writing means includes a write-in address buffer which is supplied with a write-in address; and a write-in decoder supplied with the output of said write-in address buffer.

8. A mask ROM, comprising:
   a main ROM cell array in which a plurality of ROM cells for storing data using a mask are arranged in an m (rows) by n (columns) matrix, said main ROM cell array including word lines, where each word line is connected to one ROM cell row, and bit lines, where each bit line is connected to one ROM cell column, each of said bit lines being divided into j blocks (where j corresponds to an integral number and $2<=j<=m/2$), to thereby divide said main ROM cell array into j blocks along a column direction, all of the m ROM cells which form respective j blocks being selected by a same respective one of column addresses;
   at least one column of a spare memory cell group in which data can be electrically written, a number of spare memory cells forming said spare memory cell group being equal to m/j;
   data writing means for, if a ROM cell in any block of said main ROM cell array becomes defective, writing in said spare memory cell group data associated with the ROM cell block containing a defective ROM cell;
   output bit storing means for storing data relating to an output bit of said defective ROM cell;
   address storing means for storing an address of the ROM cell column including said defective ROM cell;
   read-out data selecting means for comparing, while in a ROM data read-out mode, an input address with the address stored by said address storing means, for selecting ROM cells in said main ROM cell array when the input address and the address stored by said address storing means differ from each other, and for selecting said spare memory cell group in place of the ROM cells of a ROM cell block, said ROM cell block including said defective ROM cell and said ROM cell block being contained within one of the j blocks of a bit line, when the input address and the address stored by said address storing means are identical, and reading out the data from one of said ROM cells and a spare memory cell, in accordance with the input address and the address stored in the address storing means.

9. A mask ROM according to claim 8, wherein said data writing means includes a write-in address buffer which is supplied with a write-in address and a write-in decoder supplied with an output of said write-in address buffer.

10. A mask ROM according to claim 8, wherein said read-out data selecting means includes a main/spare selector and a spare/main selector.

11. A mask ROM according to claim 8, wherein said output bit storing means includes a bit selector.

12. A mask ROM according to claim 11, wherein said bit selector includes programmable elements for storing an output bit of said defective ROM cell.

13. A mask ROM according to claim 12, wherein said address storing means includes a spare row decoder and a spare row/column decoder.

14. A mask ROM according to claim 13, wherein said spare row/column decoder includes a plurality of partial decoders for decoding a plurality of write-in addresses and outputting a plurality of decoded write-in addresses, and programmable elements, controlled by the plurality of decoded write-in addresses from said plurality of partial decoders, for storing column addresses including an address of said defective ROM cell, and said spare column decoder includes a plurality of partial decoders for decoding a plurality of outputs from a spare row pre-decoder, and a plurality of MOS transistors controlled by the plurality of outputs from said partial decoders included in said spare column decoder.

* * * * *

UNITED STATES PATENT AND TRADEMARK OFFICE
CERTIFICATE OF CORRECTION

PATENT NO. : 5,124,948
DATED : June 23, 1992
INVENTOR(S) : Makoto Takizawa et al.

It is certified that error appears in the above-identified patent and that said Letters Patent is hereby corrected as shown below:

Title page: [73]   Insert as Assignee, --Kabushiki Kaisha Toshiba, Kawasaki-shi, Japan--.

Claim 1, column 13, line 18, before "same" insert --a--.

Claim 1, column 13, line 18, change "addresses" to --addresses;--.

Claim 3, column 13, line 57, delete "one".

On the title page: Insert --Attorney, Agent, or Firm----Finnegan, Henderson, Farabow, Garrett and Dunner--.

Signed and Sealed this

Fifth Day of October, 1993

*Attest:*

BRUCE LEHMAN

*Attesting Officer*    Commissioner of Patents and Trademarks